United States Patent [19]

Tattersall

[11] Patent Number: 4,635,749

[45] Date of Patent: Jan. 13, 1987

[54] SPEAKER ENCLOSURE

[76] Inventor: Alan M Tattersall, 179 Corio Street, Shepparton, Victoria, 3630, Australia

[21] Appl. No.: 491,338

[22] PCT Filed: Aug. 31, 1982

[86] PCT No.: PCT/AU82/00146

§ 371 Date: Apr. 29, 1983

§ 102(e) Date: Apr. 29, 1983

[87] PCT Pub. No.: WO83/00977

PCT Pub. Date: Mar. 17, 1983

[30] Foreign Application Priority Data

Aug. 31, 1981 [AU] Australia .............................. PF0534

[51] Int. Cl.[4] .............................................. H05K 5/00

[52] U.S. Cl. ................................................... 181/152

[58] Field of Search ............... 181/152, 175, 153, 159, 181/185, 189, 190, 191, 144, 145, 149, 160

[56] References Cited

U.S. PATENT DOCUMENTS

| | | | |
|---|---|---|---|
| 1,755,636 | 4/1930 | Dubilier . | |
| 1,878,088 | 9/1932 | Zwikker . | |
| 1,962,374 | 5/1934 | Woolf et al. . | |
| 3,356,179 | 12/1967 | Tompkins | 181/152 |
| 4,071,112 | 1/1978 | Keele, Jr. | 181/159 |
| 4,138,594 | 2/1979 | Klipsch . | |
| 4,187,926 | 2/1980 | Henricksen et al. | 181/190 |
| 4,369,857 | 1/1983 | Frazer et al. | 181/159 |

FOREIGN PATENT DOCUMENTS

| | | |
|---|---|---|
| 211453 | 9/1936 | Australia . |
| 1494672 | 12/1977 | United Kingdom . |

*Primary Examiner*—Michael L. Gellner
*Assistant Examiner*—Brian W. Brown
*Attorney, Agent, or Firm*—Watson, Cole, Grindle & Watson

[57] ABSTRACT

A loudspeaker horn having side wall members which converge to a throat and then diverge at a controlled horizontal dispersion angle allows horizontal dispersion from a bass driver to be maintained up to 4 KHz, permitting higher crossover frequencies and therefore use with lighter and more responsive high frequency units.

10 Claims, 6 Drawing Figures

SPEAKER ENCLOSURE

BACKGROUND OF THE INVENTION

This invention relates to a loudspeaker horn, and in particular (although not exclusively) to a a low to mid frequency loudspeaker horn for public address, theatre and band uses.

In applications where it is necessary to provide low to mid frequency sound at high volumes, such as in public address, theatre and band uses, it has been a problem to provide a sound output having an even dispersion over the entire frequency range in the vertical and, particularly, in the horizontal plane. Various types of horn enclosures have been used to control the sound emitted from the loudspeaker cone, and in particular it has been common to use exponential horns and hyperbolic horns. The exponential horn lacks a control throat in the horn and gives a very high dispersion of sound at low frequencies while being very directional at high frequencies. Hyperbolic horns also have very directional high frequencies and tend to spit out the sound rather than dispersing the sound uniformly in a pleasant manner. To overcome these difficulties with the highly directional sound emitted from exponential and hyperbolic horns toward the upper end of their range, it has been common to use the low frequency units with a relatively low crossover frequency, for example five hundred, eight hundred or twelve hundred Hz, so that the mid-range frequencies are handled by the high frequency unit. This has the attendant disadvantage that the high frequency unit must be much larger and must have a higher power handling capacity than would otherwise be required with a higher crossover frequency. Alternatively, because the high frequency unit is of a light construction to give the required high frequency response, it tends to burn out very quickly from having to handle the comparatively low mid-range frequency imposed by the crossover.

SUMMARY OF THE INVENTION

It is therefore an object of the present invention to provide a loudspeaker horn which will obviate or minimize the foregoing disadvantages in a simple yet effective manner or which will at least provide the public with a useful choice.

It is a further object of the invention to provide a loudspeaker horn which will give an improved horizontal dispersion of sound toward the upper portion of the sound range, allowing a higher crossover frequency that has heretofore been possible.

Accordingly, the invention consists in a loudspeaker horn having a vertical elongate opening adapted to be positioned in front of the speaker cone, the horn incorporating first vertical wall members extending forwardly and inwardly from either side of the opening to a throat narrower than the opening and second vertical wall members extending forwardly and outwardly from the throat.

Preferably, the width of the vertical elongate opening and the spacing of the throat from the elongate opening are designed so that the distance from all points on the cone of the loudspeaker to the throat are substantially equal.

Preferably, the included dispersion angle between the second vertical wall members is approximately 90 degrees.

Notwithstanding any other forms that may fall within its scope, one preferred form of the invention will now be described by way of example only with reference to the accompanying drawings.

DETAILED DESCRIPTION OF THE PREFERRED EMBODIMENT

In the preferred form of the invention a loudspeaker enclosure incorporating a horn according, to the invention for use with a 15 inch loudspeaker driver is constructed as follows, although it will be appreciated that the proportions of the enclosure according to the invention may be scaled up or down to suit other loudspeaker sizes.

Figure 1:
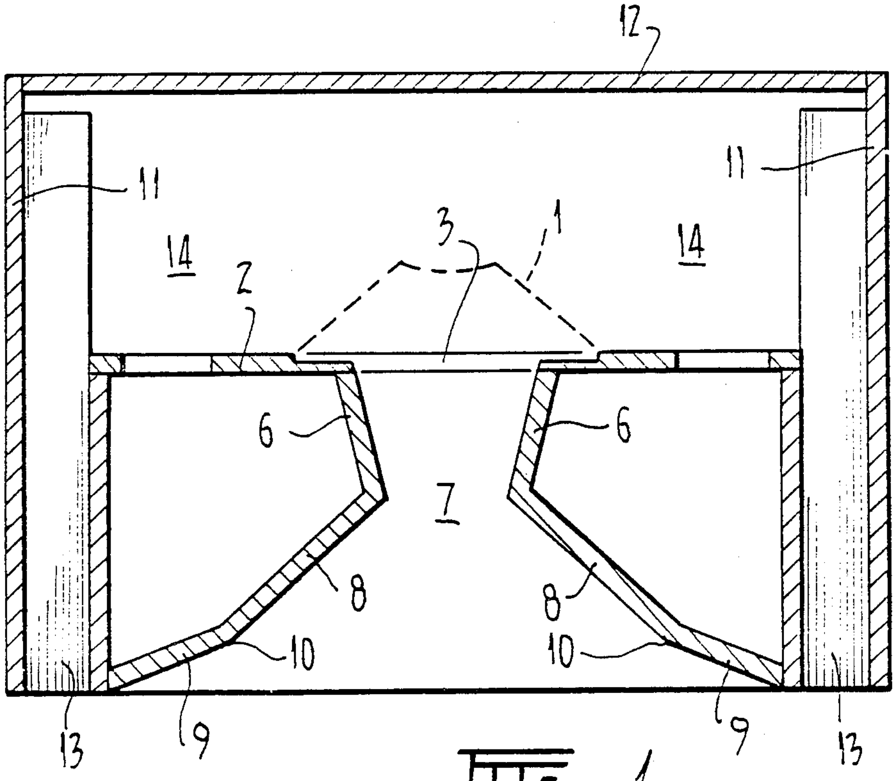
FIG. 1 is a cross-sectional plan view of a loudspeaker enclosure incorporating a horn according to the invention.

The loudspeaker, which is represented in FIG. 1 by the cone 1 (shown in broken outline) is mounted on a baffle board 2 by bolting the periphery of the loudspeaker to the baffle board in the normal manner. The baffle board, which is generally planar and is vertically oriented within the enclosure when the enclosure is operational, e.g., the bottom member 5 thereof is positioned on a horizontal support surface, is provided with a rectangular opening or slit 3 centralized in front of the speaker cone the baffle board defining opposite longer sides of the rectangular opening which extend from the generally flat top member 4 to the generally flat bottom member 5 of the speaker enclosure. It is clear that the width dimension of the rectangular opening is less than the (vertical) height dimension thereof.

The enclosure is provided with a horn extending forwardly and generally outwardly from the opening 3, and in the preferred form of the invention shown in the accompanying drawings the top and bottom surfaces of the horn are defined by the parallel top and bottom members 4 and 5 of the loudspeaker enclosure. It will be appreciated, however, that in other forms of the invention the top and bottom surfaces of the horn may diverge slightly. The sides of the horn are formed from first generally planar wall members 6 which are vertically oriented and extend forwardly of the front face of the baffle board from respective opposite sides of the vertical opening 3 and which converge to a throat area 7 whose width dimension is less than the width dimension of the opening 3. The horn further comprises second generally planar wall members 8 which are vertically oriented and are connected to the first wall members and which diverge forwardly and outwardly from the throat 7 and which preferably have an included angle of approximately 90 degrees. In the preferred form of the invention the horn is completed by third generally planar wall members 9 which are vertically oriented and which are connected to the second wall members to extend forwardly and outwardly from the forward edges 10 of the second vertical wall members and which diverge at a greater angle than the second vertical wall members 8.

Figure 2:
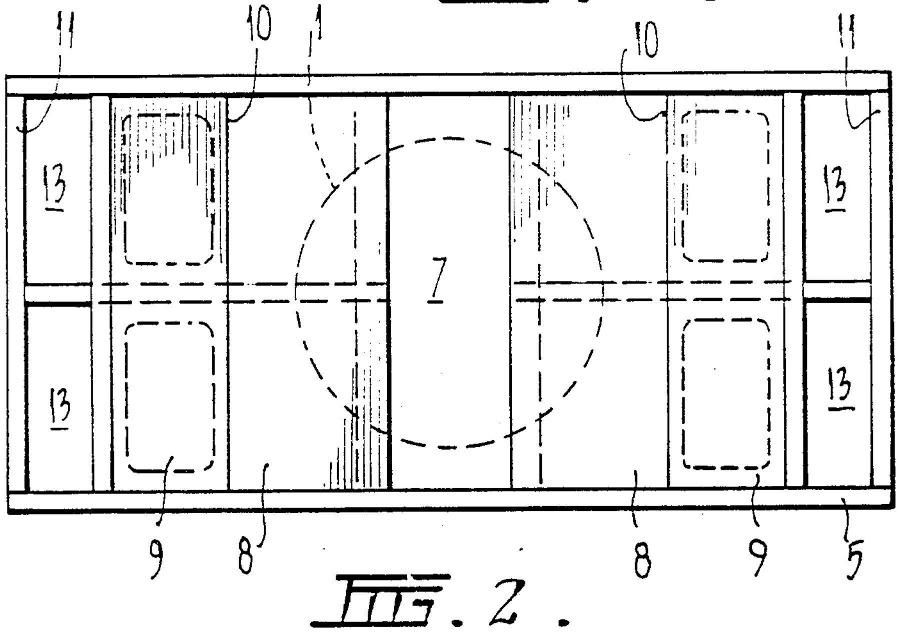
FIG. 2 is a frontal elevation of the loudspeaker enclosure shown in FIG. 1.
Figure 3:
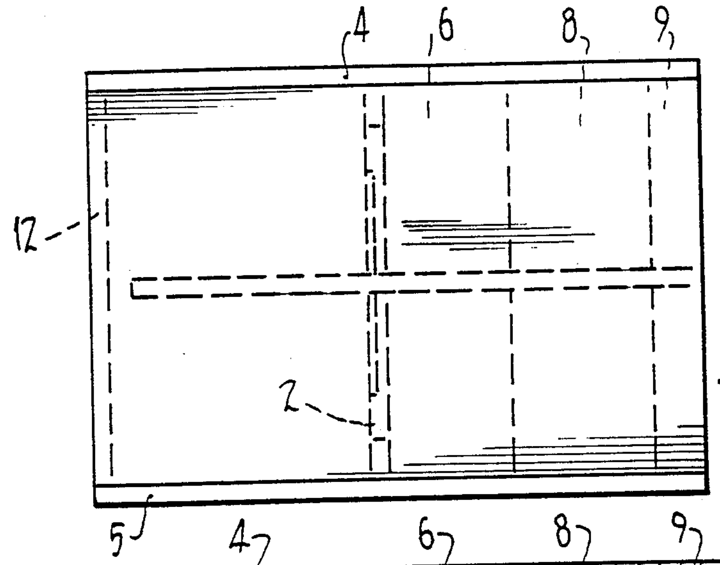
FIG. 3 is a side elevation of the loudspeaker enclosure shown in FIG. 1.

The remainder of the loudspeaker enclosure is completed in the normal manner with sides 11 and a back 12, and in the form of the invention shown in FIGS. 1 to 3 the enclosure is vented through ports 13 down the sides of the enclosure which communicate through openings 14 to the rear of the loudspeaker cone 1.

The general design criterion for the positioning of the throat 7 is to construct the width of the opening 3 and the length of the first vertical wall members 6 so that the paths from all points on the speaker cone 1 to the throat 7 are as close to equal in length to one another as it is possible to make them.

The response figures for the horizontal dispersion of a loudspeaker show that, to achieve a horizontal dispersion of 90 degrees up to a crossover frequency of 4 KHz, it is necessary to use a "piston diameter" of 5 inches. The throat 7 has therefore been sized to a throat width of 5 inches to give an effective piston diameter and an even dispersion of sound in a horizontal plane over 90 degrees at up to 4 KHz. It would be possible to use an even narrower throat to extend the frequency response over an even 90 degree horizontal dispersion even higher, but it is felt that this would lead to distortion due to higher pressures in the throat area.

In this manner the sound waves from the loudspeaker cone 1 passing forwardly into the throat 7 are defracted through the throat passing outwardly in an even horizontal dispersion of 90 degrees controlled by the second vertical wall members 8 which define an included angle of 90 degrees. The third vertical wall members 9 diverge even further outwardly to provide improved base dispersion at the low frequency end of the range.

The width of the vertical elongate opening 3 has been found to be effective at 8 inches for a 15 inch speaker cone, and could in practice be wider than this. It has been found, however, that most of the higher frequencies leaving the cone driver are within this 8 inch width and that there is little mid to high frequency sound generated from the edges of the speaker cone.

In this manner a loudspeaker horn is provided wherein the sound waves passing through the throat 7 defract outwardly to give an almost perfect horizontal throw of sound. The dispersion angle is controlled by the width of the throat 7 and by the included angle of the vertical wall members 8 to give a 90 degree dispersion in a horizontal plane, which is considered to be generally desirable for public address or band work. The horn configuration according to the invention, when used in conjunction with a high frequency unit, allows a higher crossover frequency to be used and gives a fairly even frequency response over the entire range with no "hole in the middle," which is generally present in previously known forms of horn enclosures. Because the frequency response is maintained over a horizontal dispersion angle of 90 degrees up to at least 4 KHz, it is possible to use the unit described above with a much higher crossover frequency than has heretofore been possible. This then enables a lighter high frequency unit to be used, resulting in superior high frequency response and a longer life for the high frequency unit.

Figure 6:
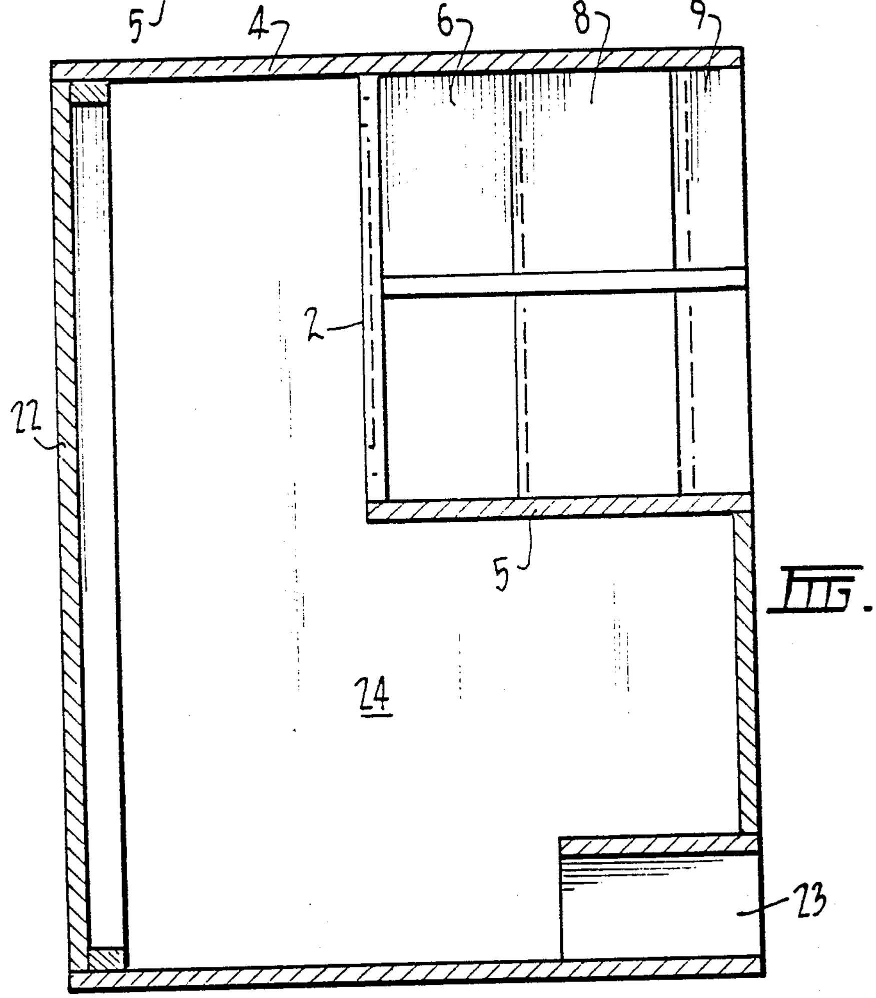
FIG. 6 is a cross-sectional elevation on the line 6—6 of FIG. 5.
Figure 4:
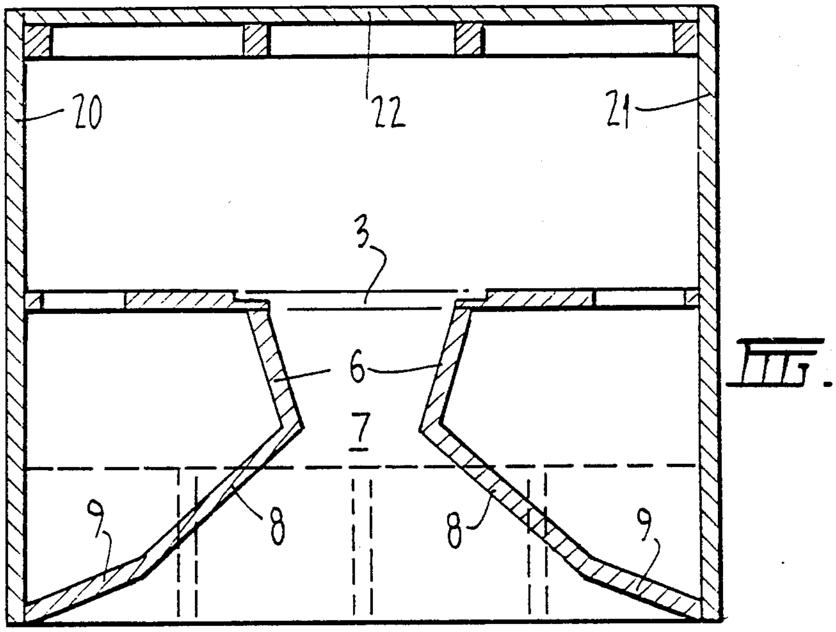
FIG. 4 is a cross-sectional plan view of a loudspeaker horn according to the invention incorporated into a bass reflex cabinet having a bottom vent.
Figure 5:
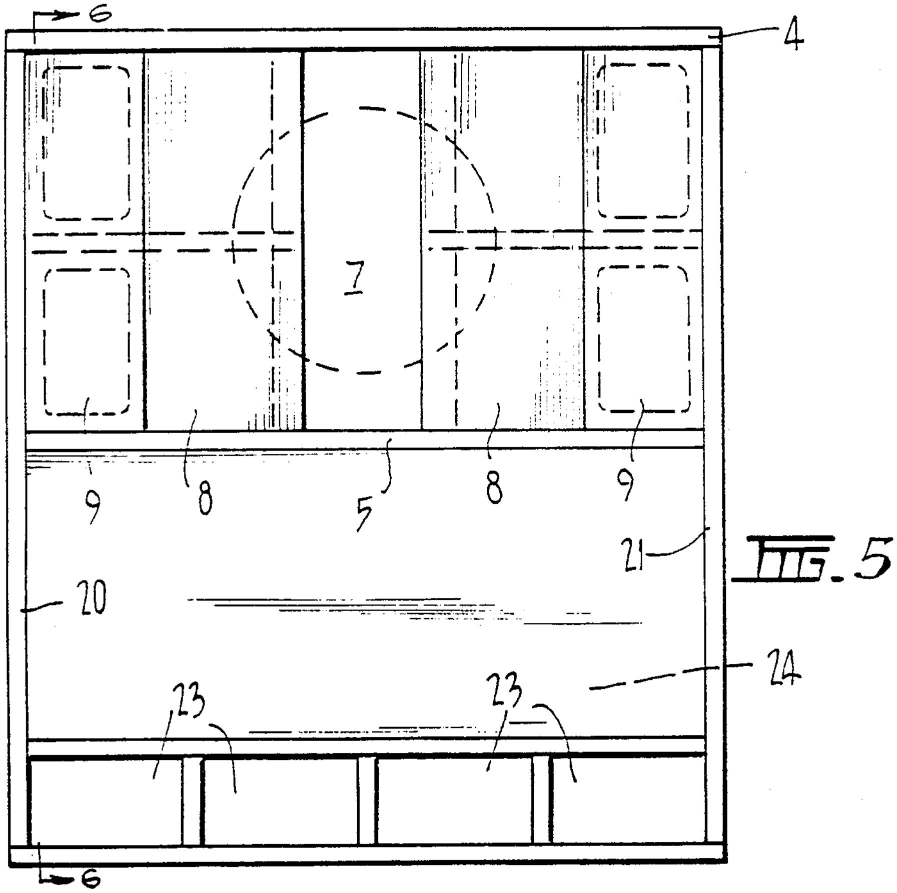
FIG. 5 is a frontal elevation of the enclosure shown in FIG. 4.

It is a further advantage of the loudspeaker enclosure as shown in FIGS. 1 to 3 that its overall size is easy to handle and transport, which is particularly advantageous in band or public address use. In this form of the invention the enclosure is vented through the side vents 13, resulting in a low flat enclosure which is easy to transport. Because the horn gives a controlled horizontal dispersion of sound, it is necessary, when using multiple units, to stack the enclosures one on top of the other, and the enclosure configuration shown in FIGS. 1 to 3 ideally lends itself to this application. Because each enclosure is only 18 inches tall for a 15 inch speaker driver 1, it is possible to to stack four such enclosures in a height of only 6 feet.

Where it is desired to give enhanced base response, such as in a high fidelity or domestic use situation, it is possible to incorporate the horn according to the invention into a larger bass reflex cabinet having bottom venting as shown in FIGS. 4 to 6. In this configuration the horn is provided in exactly the same manner as in the enclosure shown in FIGS. 1 to 3 and the horn components are referenced by the same reference numerals as previously described. The horn is incorporated into a cabinet having sides 20 and 21 and a back 22. The cabinet is narrower than the cabinet shown with reference to FIGS. 1 to 3 as the side vents 13 are eliminated and replaced with a bottom vent 23. The bottom vent is tuned for length in a manner well known with bass reflex cabinets. The advantage of the enclosure shown in FIGS. 4 to 6 is that a larger enclosed volume 24 can be provided, giving enhanced bass frequency response.

It is a further advantage of the loudspeaker horn according to the invention that the horn may be constructed using flat surfaces only and is therefore comparatively simple and cheap to construct.

Although the horn has been described as an integral part of a loudspeaker enclosure, it will be appreciated that a horn of the configuration described could readily and simply be attached to the front of an existing unit, directly in front of the bass driver.

To maintain correct exponential expansion of the horn, the vertical elongate opening 3 could be reduced in height to a centralized 8 inch square throat from which extend diverging upper and lower members meeting the top and bottom members 4 and 5 at the throat 7. It is to be understood that all references in this specification to the vertical elongate opening include this configuration.

I claim:

1. A loudspeaker horn which provides an improved horizontal dispersion of sound at frequencies up to 4 KHz, said loudspeaker horn comprising a generally planar baffle board which has a front face, a rear face and a rectangular opening therethrough; said baffle board, when vertically oriented, defining opposite vertical side edges of said rectangular opening, said opposite side edges defining a width dimension of said rectangular opening, first generally planar side wall members connected to the front face of said baffle board along the respective opposite side edges of said opening therethrough, said first side wall members extending away from said baffle board and converging towards one another to provide a single rectangular throat having a width dimension which is less than the width dimension of said rectangular opening, second generally planar side wall members respectively connected to said first side wall members at said throat to extend away from said baffle board while diverging away from one another at a first included angle, and generally planar top and bottom wall members which are respectively connected to said baffle board and to said first and second side wall members.

2. A loudspeaker horn as defined in claim 1, wherein said first included angle is about 90°.

3. A loudspeaker horn as defined in claim 1, including third generally planar side wall members respectively connected to said second side wall members to extend away from said baffle board at a second included angle which is greater than said first included angle.

4. A loudspeaker horn as defined in claim 1, wherein the opposite side edges of said rectangular opening in said baffle board has a height dimension, and wherein said height dimension is greater than the width dimension thereof.

5. A loudspeaker horn as defined in claim 4, wherein said baffle board includes means on said rear face adjacent each of said opposite side edges of said rectangular opening therethrough for mounting a speaker cone.

6. A loudspeaker horn as defined in claim 4, wherein each of said first and second side wall members is rectangular and provides top and bottom edges.

7. A loudspeaker horn as defined in claim 6, wherein said top and bottom wall members are generally planar and are respectively connected to the top and bottom edges of said first and second side wall members.

8. A loudspeaker horn as defined in claim 7, wherein said top and bottom wall members are parallel to one another.

9. A loudspeaker horn as defined in claim 7, wherein the width dimension of said rectangular opening is about 8 inches, the width dimension of said rectangular throat is about 5 inches, and said first side wall members are dimensioned such that said rectangular throat is located about 6 inches away from the front face of said baffle board.

10. A combined loudspeaker horn and speaker cone, said loudspeaker horn having improved horizontal dispersion of sound at frequencies up to 4 KHz and comprising a generally planar baffle board which has a front face, a rear face and a rectangular opening therethrough; said baffle board, when vertically oriented, defining opposite vertical side edges of said rectangular opening, said opposite side edges defining a width dimension of said rectangular opening, first generally planar side wall members connected to the front face of said baffle board along the respective opposite side edges of said opening therethrough, said first side wall members extending away from said baffle board and converging towards one another to provide a single rectangular throat having a width dimension which is less than the width dimension of said rectangular opening, second generally planar side wall members respectively connected to said first side wall members at said throat to extend away from said baffle board while diverging away from one another at a first included angle, generally planar top and bottom wall members which are respectively connected to said baffle board and to said first and second side wall members, and said speaker cone being connected to the rear face of said baffle board of said loudspeaker horn to be centered with respect to said rectangular opening therethrough, the width dimension of said rectangular opening and the distance said rectangular throat is located away from the front face of said baffle board being such that the distances from all points on the loudspeaker cone facing the rear side of said baffle board and said rectangular throat are substantially equal.

* * * * *